United States Patent
Mankos et al.

(10) Patent No.: US 7,009,177 B1
(45) Date of Patent: Mar. 7, 2006

(54) APPARATUS AND METHOD FOR TILTED PARTICLE-BEAM ILLUMINATION

(75) Inventors: Marian Mankos, Palo Alto, CA (US); Luca Grella, Gilroy, CA (US); David L. Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/040,281

(22) Filed: Jan. 20, 2005

Related U.S. Application Data

(60) Provisional application No. 60/633,955, filed on Dec. 7, 2004.

(51) Int. Cl.
*H01J 37/26* (2006.01)

(52) U.S. Cl. ............... 250/310; 250/310; 250/307
(58) Field of Classification Search ........... 250/307, 250/310
See application file for complete search history.

(56) References Cited

U.S. PATENT DOCUMENTS

| 5,319,207 | A | 6/1994 | Rose et al. | |
|---|---|---|---|---|
| 6,586,733 | B1 | 7/2003 | Veneklasen et al. | |
| 6,803,571 | B1 * | 10/2004 | Mankos et al. | 250/310 |
| 6,803,572 | B1 | 10/2004 | Veneklasen | |
| 6,878,937 | B1 * | 4/2005 | Mankos | 250/310 |

OTHER PUBLICATIONS

R.M. Tromp "Low-energy electron microscopy", Jul. 2000, pp. 503-516, vol. 44, No. 4, IBM J. Res. Develop.
V. Kolarik, et al. "Close packed prism arrays for electron microscopy", 1991, pp. 1-12, Optik 87, No. 1.
H. Rose, et al. "Outline of a versatile corrected LEEM", 1992, pp. 31-44, Optik 92, No. 1.
E. Bauer "Low energy electron microscopy", 1994, pp. 895-938, Rep. Prog. Phys. 57, IOP Publishing Ltd.

* cited by examiner

*Primary Examiner*—John R. Lee
*Assistant Examiner*—Jennifer Yantomo
(74) *Attorney, Agent, or Firm*—Okamoto & Benedicto LLP

(57) ABSTRACT

One embodiment disclosed relates to an apparatus for inspecting a substrate using charged particles. The apparatus includes an illumination subsystem, an objective subsystem, a projection subsystem, and a beam separator interconnecting those subsystems. Advantageously, the illumination subsystem includes a tilt deflector configured to controllably tilt the incident beam. The tilt of the incident beam caused by the tilt deflector is magnified prior to the incident beam impinging onto the substrate. This technique allows for achieving large beam tilts at the substrate without lens aberrations caused by introducing tilt at the objective lens and without complications due to using a tiltable stage. Other embodiments are also disclosed.

26 Claims, 4 Drawing Sheets

APPARATUS AND METHOD FOR TILTED PARTICLE-BEAM ILLUMINATION

CROSS-REFERENCE TO RELATED APPLICATIONS

The present invention claims the benefit of U.S. Provisional Patent Application No. 60/633,955, entitled "Apparatus and Method for Tilted Particle-Beam Illumination," filed Dec. 7, 2004 by inventors Marian Mankos, Luca Grella and David L. Adler, the disclosure of which is hereby incorporated by reference.

BACKGROUND OF THE INVENTION

1. Field of the Invention

The present invention relates to apparatus and methods for inspection or review of substrates, such as semiconductor wafers and masks.

2. Description of the Background Art

Low energy electron microscopy (LEEM) imaging systems which utilize electrons reflecting or mirroring off of the surface of a flat substrate are complicated when compared to conventional straight-axis electron beam (e-beam) systems. Additional complications are presented because the electron beam passes twice through one or more electron lenses, once upon incidence and a second time upon reflection.

Due to these complications, a design including a plurality of lenses arranged along one straight axis is not practically feasible, and a beam separator is needed to split the incident and reflected beams. One implementation of a beam separator uses a prism with a single shaped magnetic field as a beam separator. For example, see E. Bauer, "Low energy electron microscopy," Rep. Prog. Phys. 57 (1994), p. 895.

It is desirable to improve LEEM systems, including those utilized for the automated inspection or review of substrate surfaces. More particularly, it is desirable to improve LEEM systems with a tilt capability.

SUMMARY

One embodiment of the invention relates to an apparatus for inspecting a substrate using charged particles. The apparatus includes an illumination subsystem, an objective subsystem, a projection subsystem, and a beam separator interconnecting those subsystems. Advantageously, the illumination subsystem includes a tilt deflector configured to controllably tilt the incident beam. The tilt of the incident beam caused by the tilt deflector is magnified prior to the incident beam impinging onto the substrate. This technique allows for achieving large beam tilts at the substrate without lens aberrations caused by introducing tilt at the objective lens and without complications due to using a tiltable stage.

Other embodiments are also disclosed.

DETAILED DESCRIPTION

One conventional technique and apparatus for providing a tilt capability in an electron microscope uses a complex sample stage with tilt capability. However, the use of a tilting stage is very slow and timing consuming to operate. Moreover, it is difficult to maintain or find the same location on the substrate before and after the tilting. Furthermore, the tilting stage is a complex mechanical assembly that is typically prone to failure due to frequently moving parts. Such failures are especially time consuming due to the vacuum environment.

Another conventional technique and apparatus for providing a tilt capability in an electron microscope tilts the incident beam when it passes through the final objective lens. Unfortunately, a beam tilt in the final objective lens increases significantly the lens aberrations. This disadvantageously reduces the resolving power of the microscope tool.

Figure 1:
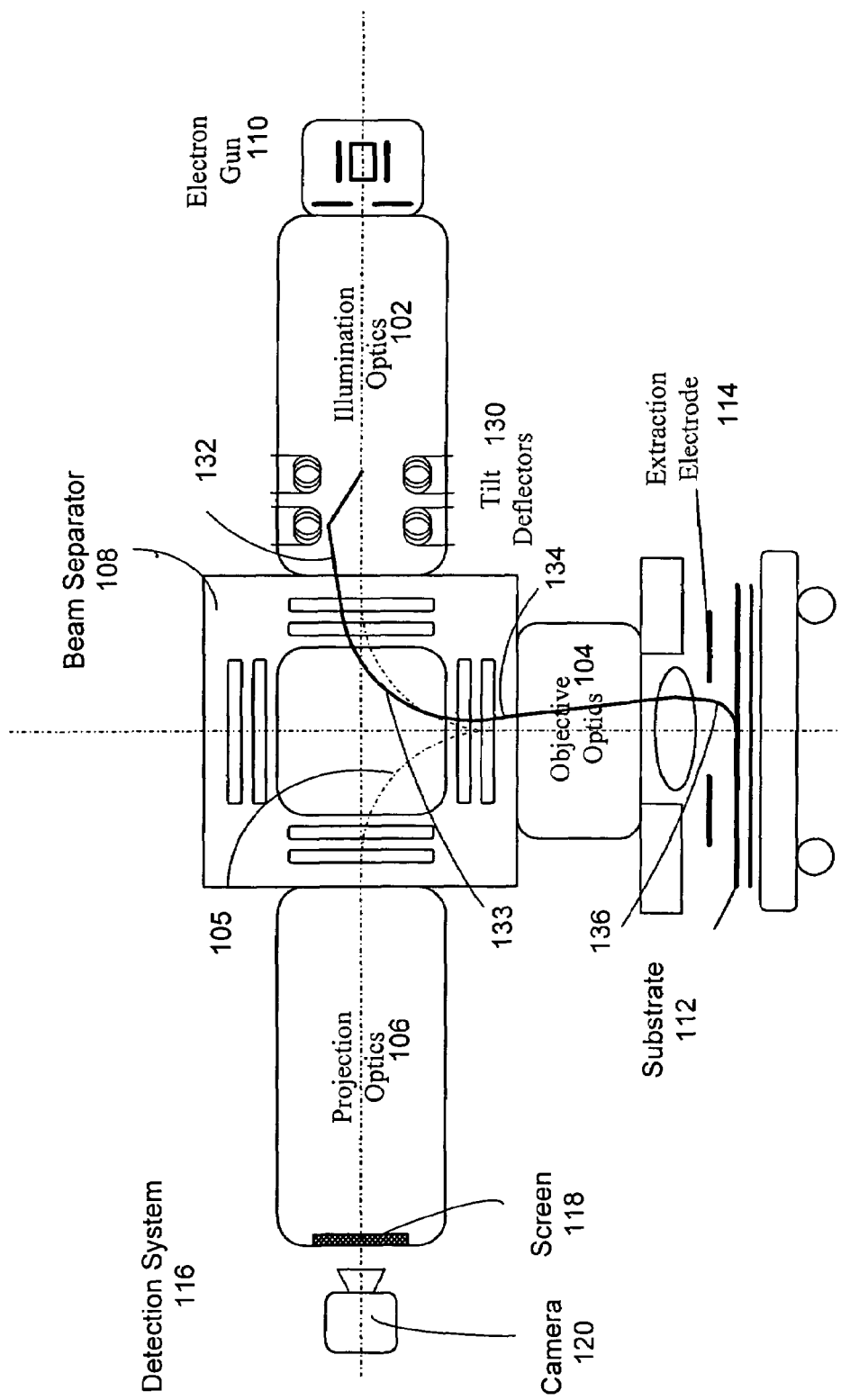
FIG. 1 is a schematic diagram depicting an apparatus for inspecting a substrate using charged particles in accordance with an embodiment of the invention.

FIG. 1 is a schematic diagram depicting an apparatus 100 for inspecting a substrate using charged particles in accordance with an embodiment of the invention. The apparatus 100 includes an illumination subsystem 102, an objective subsystem 104, a projection subsystem 106, and a beam separator 108. The beam separator 108 is coupled to and interconnects the illumination subsystem 102, the objective subsystem 104, and the projection subsystem 106.

The illumination subsystem (illumination optics) 102 is configured to receive and collimate charged particles from a charged-particle source. The charged particles may comprise electrons, and the source may comprise an electron gun 110.

In accordance with an embodiment of the invention, the illumination optics 102 advantageously includes a set of tilt deflectors 130. The tilt deflectors 130 are configured to tilt the incident beam within the illumination subsystem 102. In one configuration, the beam is tilted off the normal axis such that the tilted beam 132 enters the beam separator 108 at a slight, but controlled angle. The angle is such that the beam direction is slightly towards the objective optics 104 of the system 100. The tilt angle is preferably small to maintain low aberrations. In FIG. 1, the tilt angle depicted is exaggerated for purposes of illustration.

The beam separator 108 is configured to receive the tilted incident beam 132 from the illumination subsystem 102 and to deflect or bend 133 the incident beam by approximately 90 degrees into the objective subsystem 104. One specific embodiment of the beam separator 108 is disclosed in U.S. patent application Ser. No. 10/775,646, entitled "Prism array for electron beam inspection and defect review," filed Feb. 10, 2004, by Marian Mankos. The disclosure of the aforementioned patent application is hereby incorporated by reference. Per that disclosure, the beam separator 108 may comprise a magnetic prism array including a central magnetic section, an inner magnetic section outside the central section, and an outer magnetic section outside the inner section.

In accordance with an embodiment of the invention, since the incident beam is tilted with respect to the normal axis when entering the beam separator 108, the incident beam is similarly tilted 134 with respect to the normal axis when entering the objective optics 104. The objective subsystem (objective optics) 104 is configured to receive the tilted incident beam 134 from the beam separator 108 and to decelerate and focus the beam 136 onto the substrate 112. The beam 136 impinges upon the substrate 112 with an azimuthal angle magnified by the deceleration action of the objective lens optics 104 and further determined by the amount of beam tilt induced at the illumination optics 102 and other specific configuration aspects of the system 100.

The incident beam impinging at a tilt angle onto the substrate 108 that is typically biased at or near the gun voltage. The electrons are scattered by the specimen, thus forming a two-dimensional image of emitted electrons. The emitted electrons are re-accelerated and refocused by the objective lens 104, and then deflected by the beam separator 108 into the projection optics 106. In order to accomplish the deceleration and re-acceleration by the objective subsystem 104, the substrate is maintained at a negative high voltage potential close to that of the incident beam source while the objective optics is at ground potential. In an alternative arrangement, the substrate (and source) may be at ground potential and the objective optics (and other components) at a high voltage. Further specific details of the arrangement of lenses depend on specific parameters of the apparatus and may be determined by one of skill in the pertinent art.

The projection subsystem (optics) 106 may be configured to receive the emitted beam from the beam separator 108 and to magnify and project the emitted beam onto a detector 116. In this way, a magnified two-dimensional image of the illuminated substrate area is obtained. In one embodiment, the detector 116 may comprise a phosphorescent screen 118 and a camera 120 as depicted. In another embodiment, the detector 116 may include a charge-coupled device (CCD) array.

In accordance with an embodiment of the invention, only a very small tilt angle is introduced in the illumination optics 102 so as to maintain low aberrations. Despite the tilt angle at the illumination optics 102 being very small, a large tilt angle may be advantageously achieved as the beam impinges upon the substrate 112.

Applicant has determined that the magnification of the tilt angle at the substrate 112 appears to be due to the strong decelerating field as the electron beam approaches the substrate in such a LEEM system 100. Due to the strong decelerating field near the substrate 112, the tilt angle should be magnified by approximately the square root of the ratio of the beam energy and the landing energy. For example, for a 30 keV (30,000 electron-volts) beam energy and a landing energy of 3 eV (3 electron-volts), the ratio would be 10,000, and the square root of 10,000 is 100. Hence, in this example, the illumination angle as the beam 136 impinges at the biased substrate 112 should be about one hundred times (100×) magnified compared with the tilt angle introduced in the illumination optics 102. As such, a small and easily achievable tilt angle of 0.45 degrees (7.85 mrad) by the tilt deflectors 130 should be magnified at landing to about a 45 degree angle. Therefore, this technique advantageously provides a full range of landing angles from 0 degrees to nearly 90 degrees.

The azimuthal direction of the tilted beam at landing is determined by the amount of beam tilt induced and other specific configuration aspects of the system 100. In accordance with an embodiment of the invention, the resultant image may be analyzed to automatically determine the azimuthal angle of the tilted illuminating beam.

Figure 2:
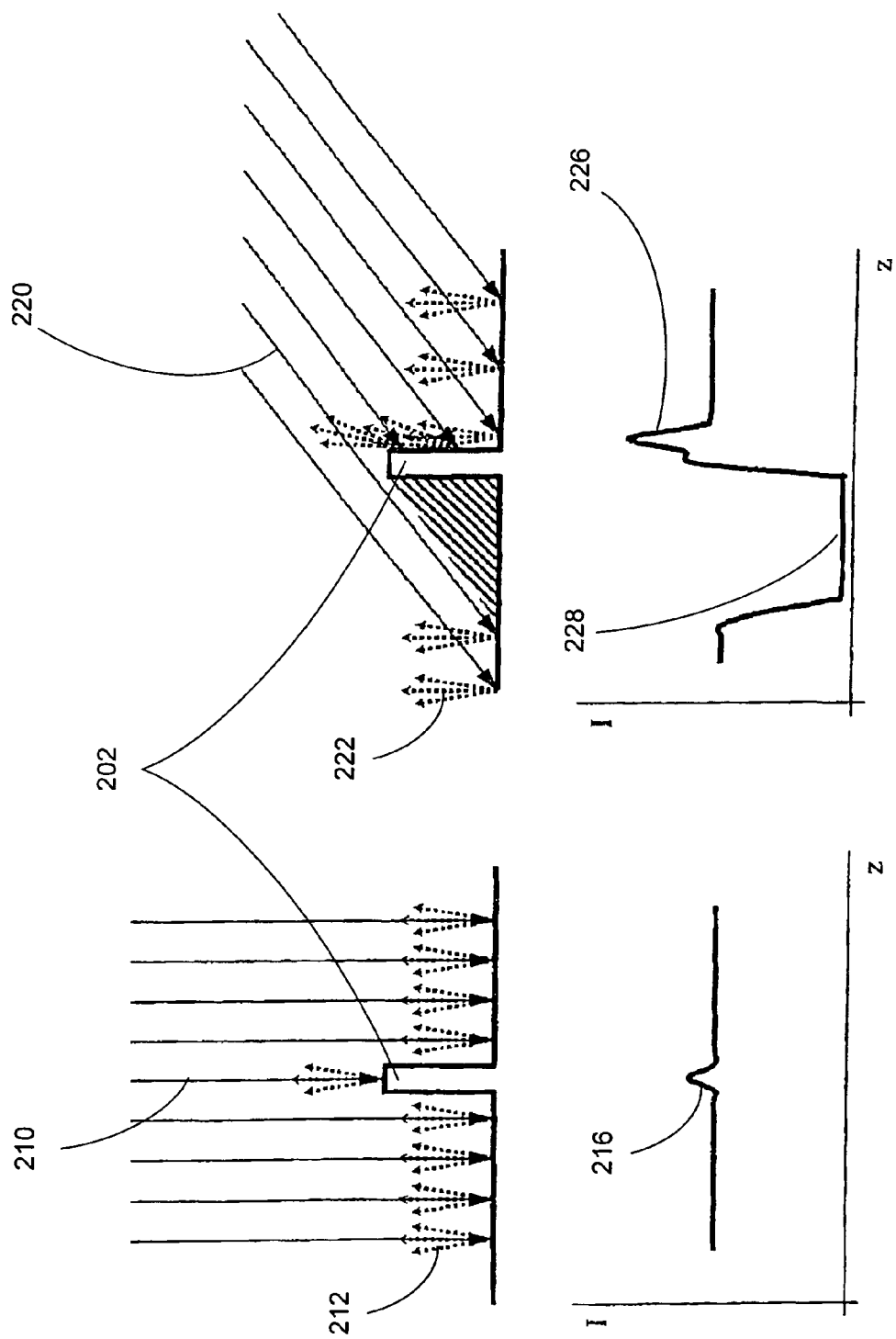
FIG. 2A is a diagram illustrating an untilted beam scattering from a feature on a substrate and a corresponding detected intensity profile.
FIG. 2B illustrating a tilted beam scattering from a feature on the substrate and a corresponding detected intensity profile in accordance with an embodiment of the invention.

FIG. 2A is a diagram illustrating an untilted beam 210 scattering from a feature 202 on a substrate and a corresponding detected intensity profile. In this example, for purposes of illustration, the feature 202 shown in the top portion of FIG. 2A rises above the surrounding surface of the substrate.

The untilted beam 210 of incident electrons is shown landing at a zero degree tilt at or near the surface of the substrate. The untilted beam 210 causes a relatively uniform distribution of emitted electrons 212 that are scattered from the substrate.

The intensity distribution of emitted electrons is illustrated in the bottom portion of FIG. 2A. The intensity I is shown as relatively uniform with a slight increase or bup 216 in the intensity at the position Z of the feature 210 due to a greater number of electrons being emitted from the feature rising above the surrounding surface.

FIG. 2B illustrating a tilted beam 220 scattering from the feature 202 on a substrate and a corresponding detected intensity profile in accordance with an embodiment of the invention. The feature 202 shown in FIG. 2B is the same as shown in FIG. 2A. In FIG. 2B, however, the incident beam 220 is tilted or angled as it approaches the substrate surface.

The resultant emitted electrons 222 have a distinctive distribution caused by the tilted incident beam 220. The intensity distribution of the emitted electrons 222 is shown in the bottom portion of FIG. 2B. Here, the intensity "I" is shown with a substantially nonuniform profile caused by the presence of the feature 202.

As the tilted beam 220 impinges upon the sidewall of the feature 202 that faces the incoming beam 220, a corresponding peak 226 in the distribution of emitted electrons 222 is generated. The strong peak 226 is caused, in this instance, by the strongly enhanced emission due to the capture of illuminating electrons on the side wall.

Furthermore, a shadowing effect occurs because the feature 202 blocks a portion of electrons from the tilted incident beam 220. This results in a shadow 228 of the defect 202 in the intensity distribution shown at the bottom of FIG. 2B.

With increasing tilt angle, the shadow 228 extends further, and the difference signal becomes stronger (i.e. the intensity in the shadow area 228 becomes lower relative to the surrounding area). This means that for a given defect size, the inspection can be carried out with a larger pixel size and still find the defect. By using a larger pixel size, the throughput of the inspection may be increased.

Advantageously, this technique provides a means for large beam tilts to be achieved at the sample without tilting the beam in the objective lens and without using a tilting stage. This allows for the achievement of high spatial resolution in the tilted mode while using a non-tilting stage, such as a more simple x-y stage.

The tilt deflectors 130 in the illumination subsystem 102 discussed above may be implemented in various ways. The implementations may use magnetic fields, electrostatic fields, or a combination of both. The fields may vary in strength and are controllably configured so as to achieve a desired tilted trajectory for the incident beam.

Figure 3:
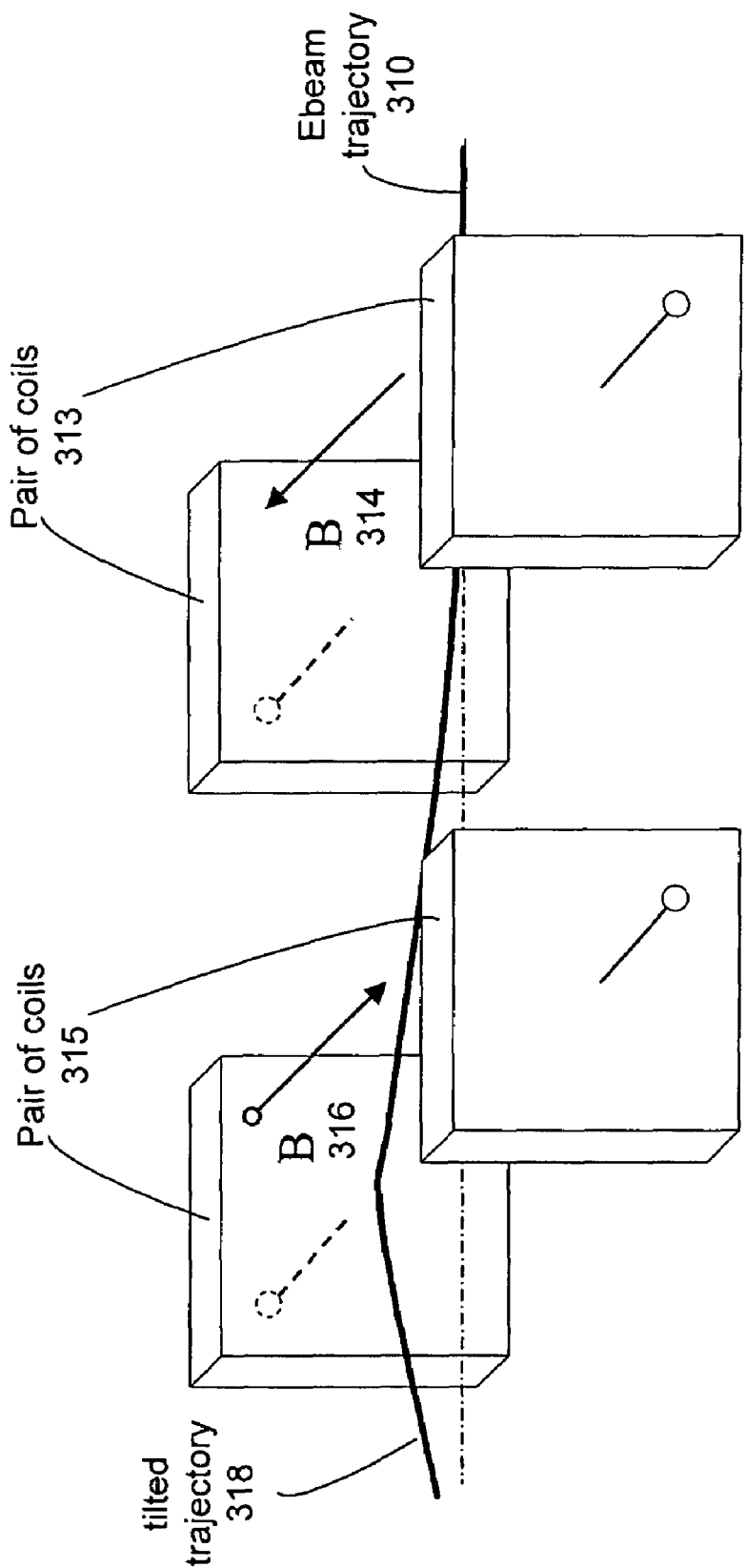
FIG. 3 is a diagram illustrating an electron beam trajectory being tilt deflected using magnetic fields in accordance with an embodiment of the invention.

One implementation of the tilt deflectors 130 (as suggested by the coils in FIG. 1) may run electric current through coils to generate magnetic fields so as to tilt the incident beam. FIG. 3 is a diagram illustrating an electron beam trajectory 310 (traveling from right to left) being tilt deflected using magnetic fields in accordance with an embodiment of the invention. In this example, the e-beam trajectory 310 is bent in one direction (upwards in the drawing) by a first pair of coils 313 generating a first magnetic field 314, then is bent in the other direction (downwards in the drawing) by a second pair of coils 315 generating a second magnetic field 316. The strengths and distances covered by the magnetic fields are configured so as to achieve a desired tilted trajectory 318 (going from right to left but tilted downwards in the drawing) after the fields have been traveled across by the e-beam. Like in FIG. 1, the magnitude of the tilt in the e-beam trajectory 318 is exaggerated in FIG. 3 for purposes of illustration.

Figure 4:
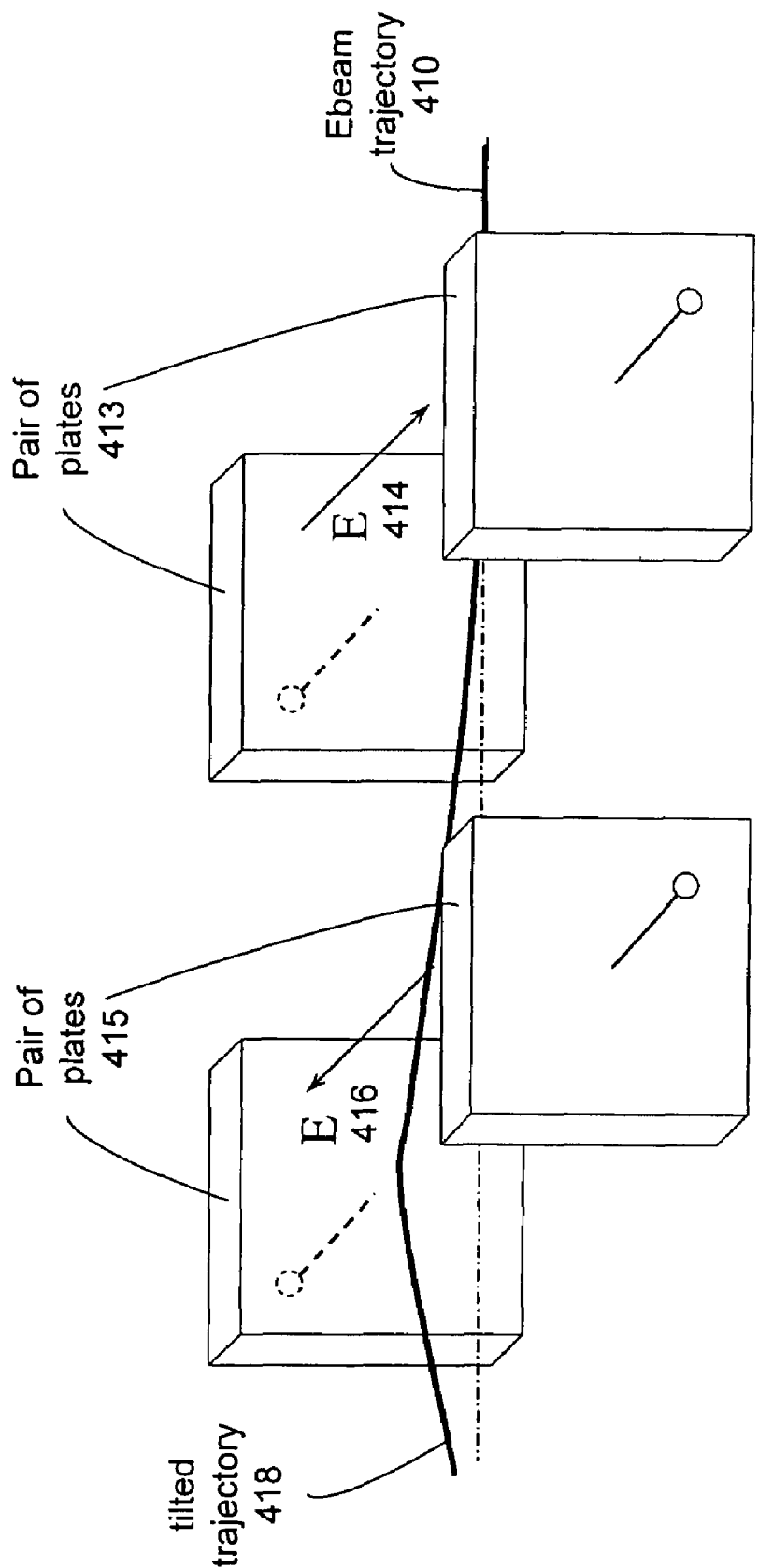
FIG. 4 is a diagram illustrating an electron beam trajectory being tilt deflected using electrostatic fields in accordance with an embodiment of the invention.

In one implementation of the tilt deflectors 130, electrostatic fields may be generated by charging plates or other electrodes so as to tilt the incident beam. FIG. 4 is a diagram illustrating an electron beam trajectory 410 (traveling from right to left) being tilt deflected using electrostatic fields in accordance with an embodiment of the invention. In this example, the e-beam trajectory 410 is bent in one direction (towards the far plate in the drawing) by a first pair of plates 413 generating a first electrostatic field 414, then is bent in the other direction (away from the far plate in the drawing) by a second pair of plates 415 generating a second electrostatic 416. The strengths and distances covered by the electrostatic fields are configured so as to achieve a desired tilted trajectory 418 (going from right to left but tilted away from the far plate in the drawing) after the fields have been traveled across by the e-beam. Like in FIGS. 1 and 3, the magnitude of the tilt in the e-beam trajectory 418 is exaggerated in FIG. 4 for purposes of illustration.

In another implementation, both electrostatic and magnetic fields may be used. For example, the beam may be first bent in one by a magnetic field, then bent in another direction by an electrostatic field. Or, the beam may be first bent in one by an electrostatic field, then bent in another direction by a magnetic field. The fields would be configured to achieve the desired tilt in the final trajectory.

The above-described diagrams are not necessarily to scale and are intended be illustrative and not limiting to a particular implementation. The above-described invention may be used in an automatic inspection or review system and applied to the inspection or review of optical or X-ray masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for inspecting a substrate using charged particles, the apparatus comprising:
    an illumination subsystem configured to generate an incident charged-particle beam;
    an objective subsystem configured to receive the incident beam, to focus the incident beam onto the substrate, and to retrieve an emitted beam from the substrate;
    a projection subsystem configured to receive the emitted beam and to project the emitted beam onto a detector;
    a beam separator coupled to and interconnecting the illumination subsystem, the objective subsystem, and the projection subsystem; and
    a tilt deflector in the illumination subsystem that is configured to controllably tilt the incident beam.

2. The apparatus of claim 1, wherein the tilt of the incident beam caused by the tilt deflector is magnified prior to the incident beam impinging onto the substrate.

3. The apparatus of claim 2, wherein the tilt is magnified during deceleration of the incident beam as the incident beam approaches the substrate.

4. The apparatus of claim 3, wherein the magnification during deceleration is approximately equal to a square root of a ratio of beam energy to landing energy.

5. The apparatus of claim 2, wherein the magnification provides a full range of landing angles from 0 degrees to nearly 90 degrees.

6. The apparatus of claim 2, wherein the tilt introduced by the tilt deflector is less than one degree.

7. The apparatus of claim 1, wherein the charged particles comprise electrons.

8. The apparatus of claim 1, wherein the tilt deflector utilizes electrostatic fields configured to tilt a trajectory of the incident beam.

9. The apparatus of claim 1, wherein the tilt deflector utilizes magnetic fields configured to tilt a trajectory of the incident beam.

10. The apparatus of claim 1, wherein the tilt deflector utilizes both electrostatic and magnetic fields configured to tilt a trajectory of the incident beam.

11. The apparatus of claim 1, wherein the incident beam impinges upon the substrate at an azimuthal direction dependent on the tilt of the incident beam.

12. The apparatus of claim 11, further comprising an image analyzer configured to process image data to determine the azimuthal direction of the tilted incident beam at landing.

13. A method of inspecting a substrate using charged particles, the method comprising:
    generating an incident charged-particle beam;
    controllably tilting the incident beam by a first tilt angle;
    bending the incident beam through a prism array;
    focusing and decelerating the incident beam such that the incident beam impinges on a substrate at a second tilt angle;
    retrieving an emitted charged-particle beam;
    bending the emitted beam through the prism array; and
    projecting the emitted beam to a detection system.

14. The method of claim 13, wherein the second tilt angle is magnified in comparison to the first tilt angle.

15. The method of claim 14, wherein the magnification is approximately equal to a square root of a ratio of beam energy to landing energy.

16. The method of claim 15, wherein the controllable tilting of the incident beam and the magnification provides a full range of the second tilt angle from 0 degrees to nearly 90 degrees.

17. The method of claim 13, wherein the first tilt angle is less than one degree.

18. The method of claim 13, wherein the charged particles comprise electrons.

19. The method of claim 13, wherein the controllable tilting is performed by electrostatic fields configured to tilt a trajectory of the incident beam.

20. The method of claim 13, wherein the controllable tilting is performed by magnetic fields configured to tilt a trajectory of the incident beam.

21. The method of claim 13, wherein the controllable tilting is performed by both electrostatic and magnetic fields configured to tilt a trajectory of the incident beam.

22. The method of claim 13, wherein the incident beam impinges upon the substrate at an azimuthal direction dependent on the tilt of the incident beam.

23. The method of claim 22, further comprising analyzing image data from the detection system to determine the azimuthal direction of the tilted incident beam at landing.

24. The method of claim 13, wherein a shadowing effect from a defect is discernable in image data from the detection system.

25. A low-energy electron beam inspection apparatus, the apparatus comprising:

an illumination system for generating an incident electron beam;

an objective lens system for decelerating and focusing the incident beam to a substrate and for accelerating and refocusing an emitted electron beam;

a projection system for projecting the emitted beam to a detection system to generate two-dimensional image data;

a beam separator configured to bend the incident beam towards the substrate and further configured to bend the emitted beam towards the projection system; and a controllable tilting mechanism in the illumination system for controllably tilting the incident beam by a first tilt angle such that the incident beam impinges upon the substrate at a second tilt angle, wherein the second tilt angle is magnified substantially from the first tilt angle.

26. The apparatus of claim 25, wherein an image with tilted illumination is obtained without introducing tilt by the objective lens system and with an untilted stage.

* * * * *